US007948306B2

(12) United States Patent
Claassen

(10) Patent No.: US 7,948,306 B2
(45) Date of Patent: May 24, 2011

(54) ACTIVE POWER FILTER METHOD AND APPARATUS

(75) Inventor: Franciscus Gerardus Johannes Claassen, Oploo (NL)

(73) Assignee: Xerox Corporation, Norwalk, CT (US)

( * ) Notice: Subject to any disclaimer, the term of this patent is extended or adjusted under 35 U.S.C. 154(b) by 121 days.

(21) Appl. No.: 12/400,382

(22) Filed: Mar. 9, 2009

(65) Prior Publication Data

US 2010/0225385 A1 Sep. 9, 2010

(51) Int. Cl.
*H03K 5/00* (2006.01)
*H02M 7/537* (2006.01)

(52) U.S. Cl. ......... 327/552; 327/558; 363/131; 323/207

(58) Field of Classification Search .......... 327/551–559, 327/336–337, 532–533; 363/131; 323/205, 323/207
See application file for complete search history.

(56) References Cited

U.S. PATENT DOCUMENTS 6,018,473 A 1/2000 Claassen
6,317,571 B1 11/2001 Adams
6,608,770 B2 8/2003 Vinciarelli et al.
6,901,226 B2 5/2005 Claassen
7,091,704 B2 * 8/2006 Chou et al. .................... 323/207
7,236,379 B2 6/2007 Lu
7,272,026 B2 * 9/2007 Chou et al. .................... 363/131
2007/0096562 A1 5/2007 Bainbridge et al.

OTHER PUBLICATIONS

"Power Factor: Definition and Application," A/SEA Power Systems, Technical Note TN-001, 2 pages, Copyright 2000-2003 ASEA Power Systems, Mar. 26, 2004.
"Reducing Power Factor Cost," Fact Sheet, The energy savings network, 4 pages.
Power Factor, 8 pages, Web Site:http://en.wikipedia.org/wiki/Power_factor_correction, Dec. 3, 2008.
Power Problems, Power Quality and Rotary Systems, "Power Factor""What is Power Factor?", 8 pages.
"Power Factor Correction and Harmonic Resonance: A Volatile Mix," PQ Corner, Jun. 2003, EC&M, 3 pages.

* cited by examiner

*Primary Examiner* — Dinh T. Le
(74) *Attorney, Agent, or Firm* — Fay Sharpe LLP

(57) ABSTRACT

This disclosure provides active power filter methods and apparatus to control the PF, harmonics and/or ripple current associated with powering electrical devices. According to one exemplary aspect, an active power filter is configured to measure the momentary ac line output current, measure the momentary ac line input current and switch an energy buffer to provide additional current to the ac line output or draw current from the ac line input to control the PF associated with the device.

14 Claims, 10 Drawing Sheets

ACTIVE POWER FILTER METHOD AND APPARATUS

BACKGROUND

This disclosure related to active power filters. According to one exemplary embodiment, this disclosure provides active power filter methods and apparatus for power factor (PF) and harmonic control of a power supply associated with a printing device.

The primary purpose of a power filter is to control the PF associated with the powered device. The PF is the ratio of real power to apparent power, where the ideal PF is equal to 1. As a practical matter, the PF associated with a load (i.e. the power supply and the device powered by the power supply) is a metric which indicates the percentage of supplied power actually being used to operate the device.

Another purpose of a power filter is to reduce the harmonic components associated with the input current and voltage. Typically, loads are not completely resistive because of the capacitive and inductive nature of the powered devices. Consequently, harmonics are generated which shift the input voltage and current out of phase. These harmonics can also contribute to reducing the efficiency of the powered device.

To improve the PF and harmonic control of powered devices, it is common to use passive filters and active filters operatively connected to the power supply associated with the device. Commonly, passive filters are used because of their simplicity. Passive filters are primarily composed of passive elements, such as capacitors and inductors, which offset the advance or lag of the current phase to reduce the harmonics associated with the device.

One disadvantage associated with passive filters is the need for relatively large components for dealing with large currents and voltages.

There is a need for active power filters to accommodate large currents and voltages to reduce the component sizes necessary to control the PF and harmonics associated with a powered device, such as a printing device.

INCORPORATION BY REFERENCE

U.S. Pat. No. 6,317,571 entitled "PRINTER FUSER HEATER CONTROLLER WITH POWER FACTOR CORRECTION," issued Nov. 13, 2001 to Adams is totally incorporated herein by reference in its entirety.

BRIEF DESCRIPTION

In one aspect of this embodiment, an active line filter is disclosed which comprises an ac line input; an ac neutral connection point; an ac line output; and an energy buffer, operatively connected to the neutral connection point and line output, wherein the active line filter is configured to measure the momentary line output current, measure the momentary line input current, switch the energy buffer to provide additional current to the line output when the momentary line output current is greater than the momentary line input current and switch the energy buffer to draw current from the line input when the momentary line output current is less than the momentary line input current.

In another aspect of this embodiment, a printing apparatus is disclosed comprising a printing device; a power supply operatively connected to the printing device; and an active line filter comprising: an ac line input: an ac neutral connection point; an ac line output; and an energy buffer, operatively connected to the neutral connection point and line output, wherein the active line filter is configured to measure the momentary line output current, measure the momentary line input current, switch the energy buffer to provide additional current to the line output when the momentary line output current is greater than the momentary line input current and switch the energy buffer to draw current from the line input when the momentary line output current is less than the momentary line input current.

In still another aspect of this embodiment, a method of operating an active line filter is disclosed which includes an ac line input, an ac neutral connection point or ac line output and an energy buffer operatively connected to the neutral connection point and line output, the method comprising A) measuring the momentary line output current; B) measuring the momentary line input current; C) switching the energy buffer to provide additional current to the line output when the momentary line output current is greater than the momentary line input current; and D) switching the energy buffer to draw current from the line input when the momentary line output current is less than the momentary line input current.

DETAILED DESCRIPTION

The power usage in older legacy systems creates current harmonics in the power lines. In order to meet the new harmonics requirements, an active line filter in front of such system or integrated with the system can solve this problem. In this case no redesign of the system (e.g. Low Voltage Power Supplies and AC loads) is required.

The here described power stage uses only one fullbridge mosfet switch and energy storage bulk capacitor for both the positive and negative mains cycle. Also, no blocking diodes are used, this function is taken over by the controlled use of the mosfet acting as flyback diode. In general this is a cost effective solution which uses relatively less power components. For this power circuit also a unique bipolar control circuit is provided.

A power circuit for an active line filter should be able to take extra current from and supply extra current to the mains line. It should also be able to operate in the positive as well as the negative half mains cycle. The circuit illustrated in FIG. 1 accomplishes these objectives.

Figure 1:
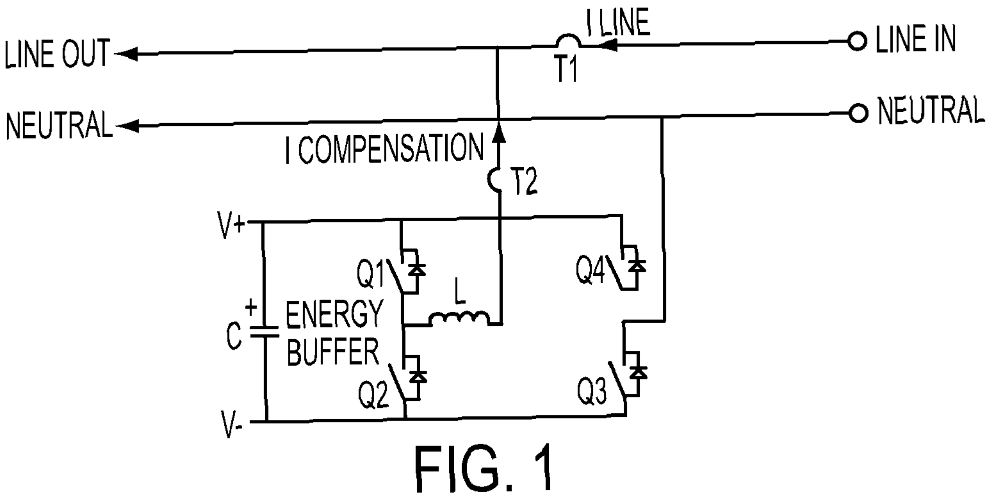
FIG. 1 is a schematic of an active power filter according to an exemplary embodiment of this disclosure.

Referring to FIG. 1, when the momentary line out current is higher than the sinusoidal level the circuit shall supply extra current in order to support the mains line. In this mode the power circuit shall act as a normal buck converter. The energy is taken from the capacitor C. During the positive half mains period Q3 is closed and Q4 open. The V− line is now connected to the Neutral line. In buck mode Q1 is acting as the power switch and Q2 is acting as the flyback diode. During the negative half mains cycle Q3 is open and Q4 closed. The V+ line is now connected to Neutral. In this stage Q2 acts as the power switch and Q1 as the flyback diode (both current and voltage are negative in this mode).

When the momentary line out current is lower than the sinusoidal value the circuit needs to draw extra current from the line. The circuit is now acting as a boost converter like in a normal pfc circuit. The capacitor voltage shall always be higher than the highest momentary mains voltage.

During a positive half mains cycle and in boost mode, (Q3 closed) Q2 is acting as the boost switch and Q1 as the flyback diode.

In the negative period Q4 is closed and now Q1 is the boost switch with Q2 acting as flyback diode.

There are a couple of advantages with this topology:

(mosfet) Switches can be turned on when they are in diode mode (synchronous rectifier) so that conduction losses are reduced.

The V− line can be used as return line for all control and driver circuits (Normal highside low side mosfet drivers can be used)

Figure 2:
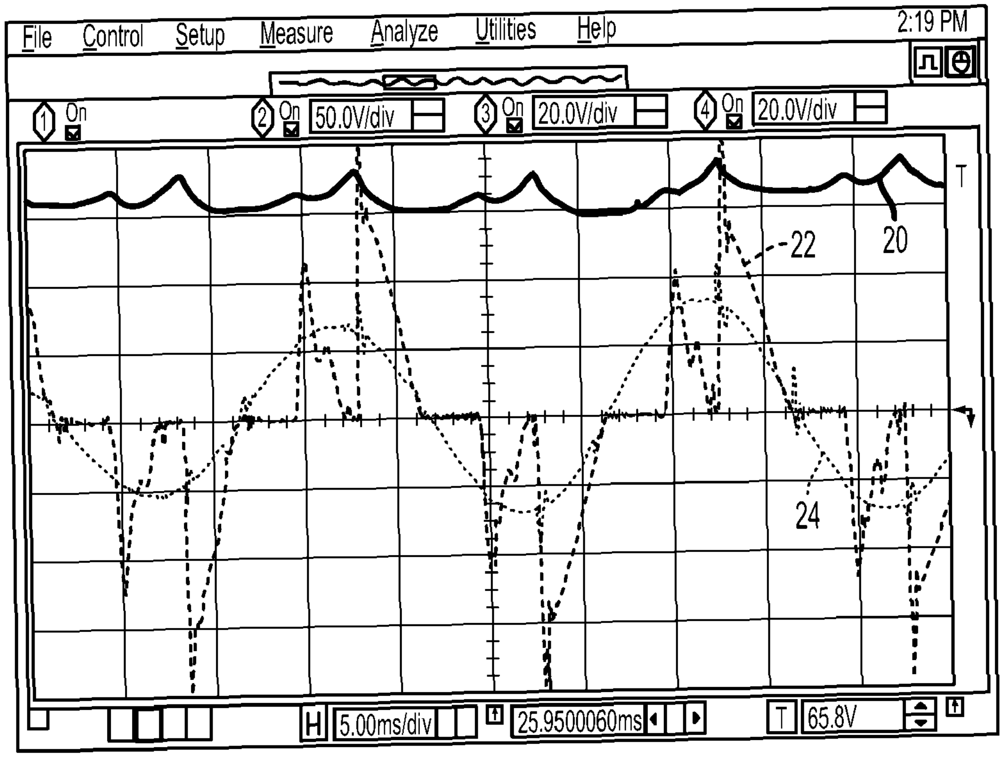
FIG. 2 is a graph of the distorted load current and corrected line current according to one exemplary aspect of this disclosure.

Line 22 in FIG. 2 shows a distorted load current. Line 24 is the corrected line current. When the load current is larger than the corrected line current energy is taken from the buffer capacitor. Its voltage shown by the line 20 is then going down. The average current of both lines is identical so that the average capacitor voltage is not changing.

Figure 3A:
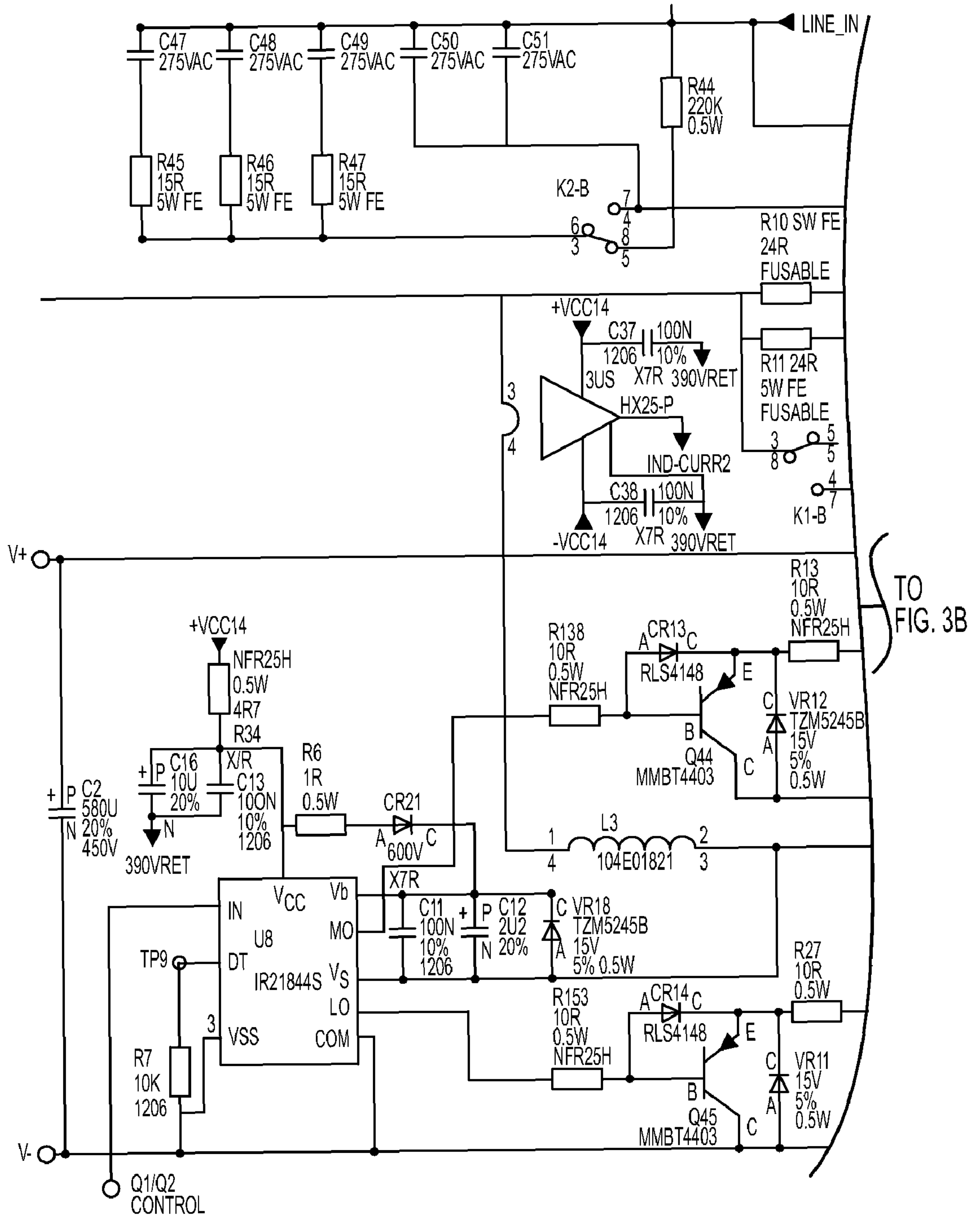
FIG. 3 is another schematic of an active power filter according to an exemplary embodiment of this disclosure.
Figure 3B:
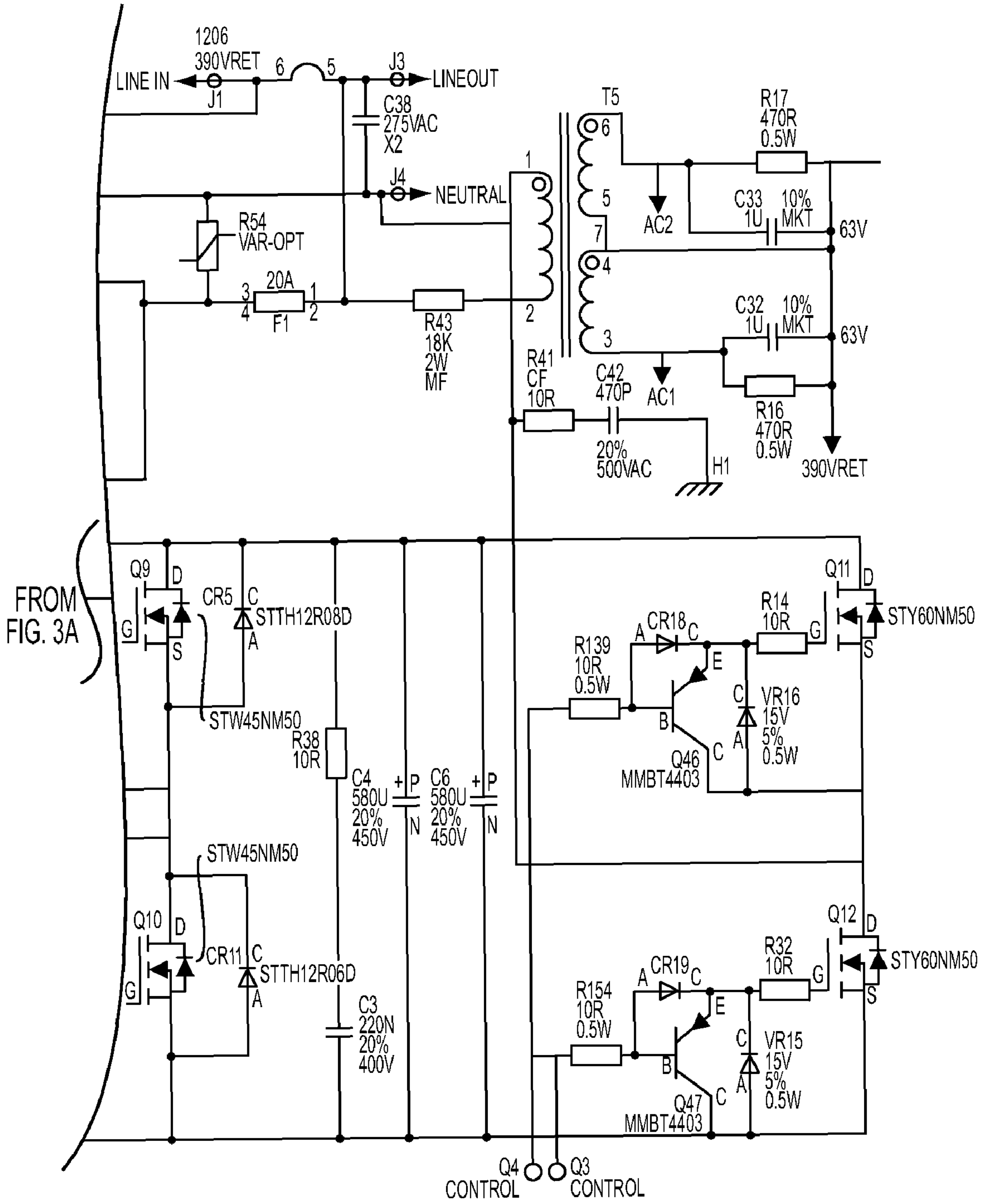

FIG. 3 shows a part of an active filter mainboard schematic according to an exemplary embodiment. Transformer T5 is used to make a sine wave reference signal used in the control section which will be described with reference to FIG. 4.

The primary side of this converter is connected directly across the energy buffer capacitors.

Figure 4:
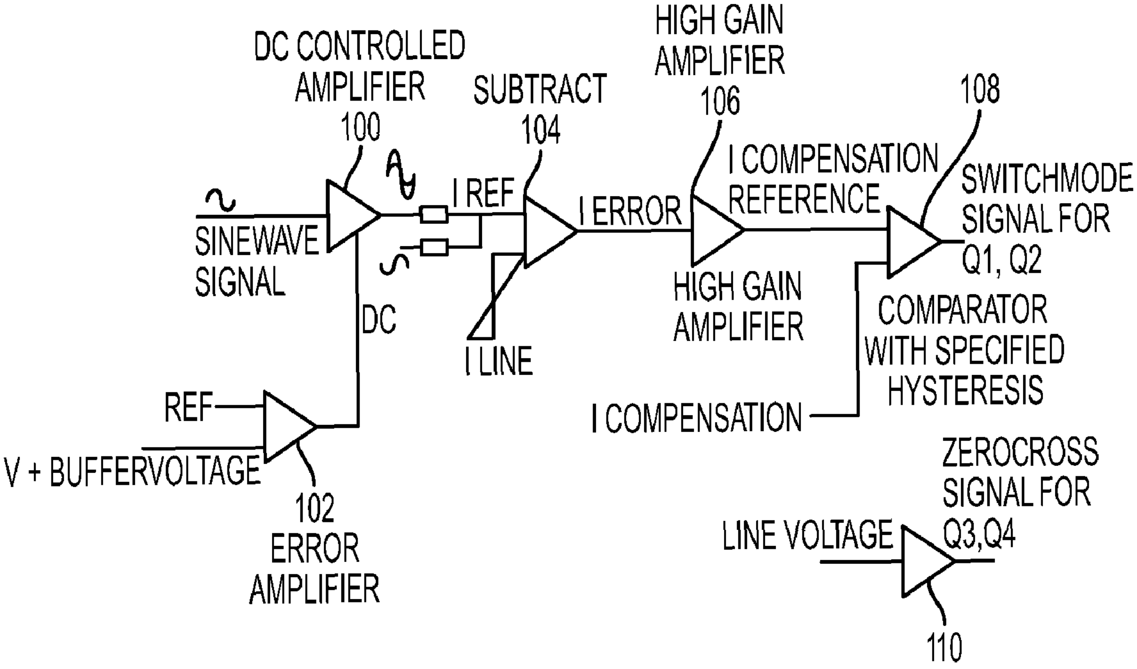
FIG. 4 is a schematic of an exemplary control circuit associated with the control of an active power filter as illustrated in FIGS. 1 and 3.

The control circuit in FIG. 4 controls the line current "I line" such that its shape is sinusoidal and it regulates the average buffer voltage "V+".

The overall feedback loop is the one which regulates the buffer voltage "V+". This is done by the error amplifier which generates a dc signal which is fed into the DC controlled amplifier. If for example, the buffer voltage is too low, the dc signal will go up. This results in a larger sinewave signal on the output of the DC controlled amplifier. The "I compensation current" will now be changed such that the "I line" current follows the increased "Iref" signal. As soon as the average line current is larger than the average load current the buffer voltage will go up. There is a small sinewave signal of reversed polarity added to Iref so that it is also possible to feed some energy back into the mains line. Notably, it is useful to discharge the buffer capacitor in case it is charged too much.

Continuing with the description of the control in FIG. 4, "I line" is subtracted from the "I ref" signal and the result "I error" is amplified in order to get sufficient gain in the feedback loop. This "High gain amplifier" is also used to add proper phase compensation. The output is used as the reference signal to control the compensation current. When the "I compensation" current is larger than "I compensation reference" plus hysteresis offset, Q2 is turned on. "I compensation" is now ramping down. The di/dt rate is defined by the momentary line voltage and the inductance of L. As soon as this current comes below the "I compensation reference" min hysteresis offset, Q2 is turned off and Q3 turned on. The inductor current is now ramping up. The triangular compensation current is switching around the "I compensation reference" level.

The advantages of this method are:

Signals can be bipolar as the amplifiers have a plus and min supply line with the V− line as return path. Normal pfc controllers as well as pwm (pulse width modulated) and current mode regulators have only a single polarity.

The reaction speed is only limited by loop gain and di/dt capability.

The circuit is independent of the actual line polarity. The switchmode signal to Q1 and Q2 doesn't have to be reversed when line polarity changes.

Figure 5:
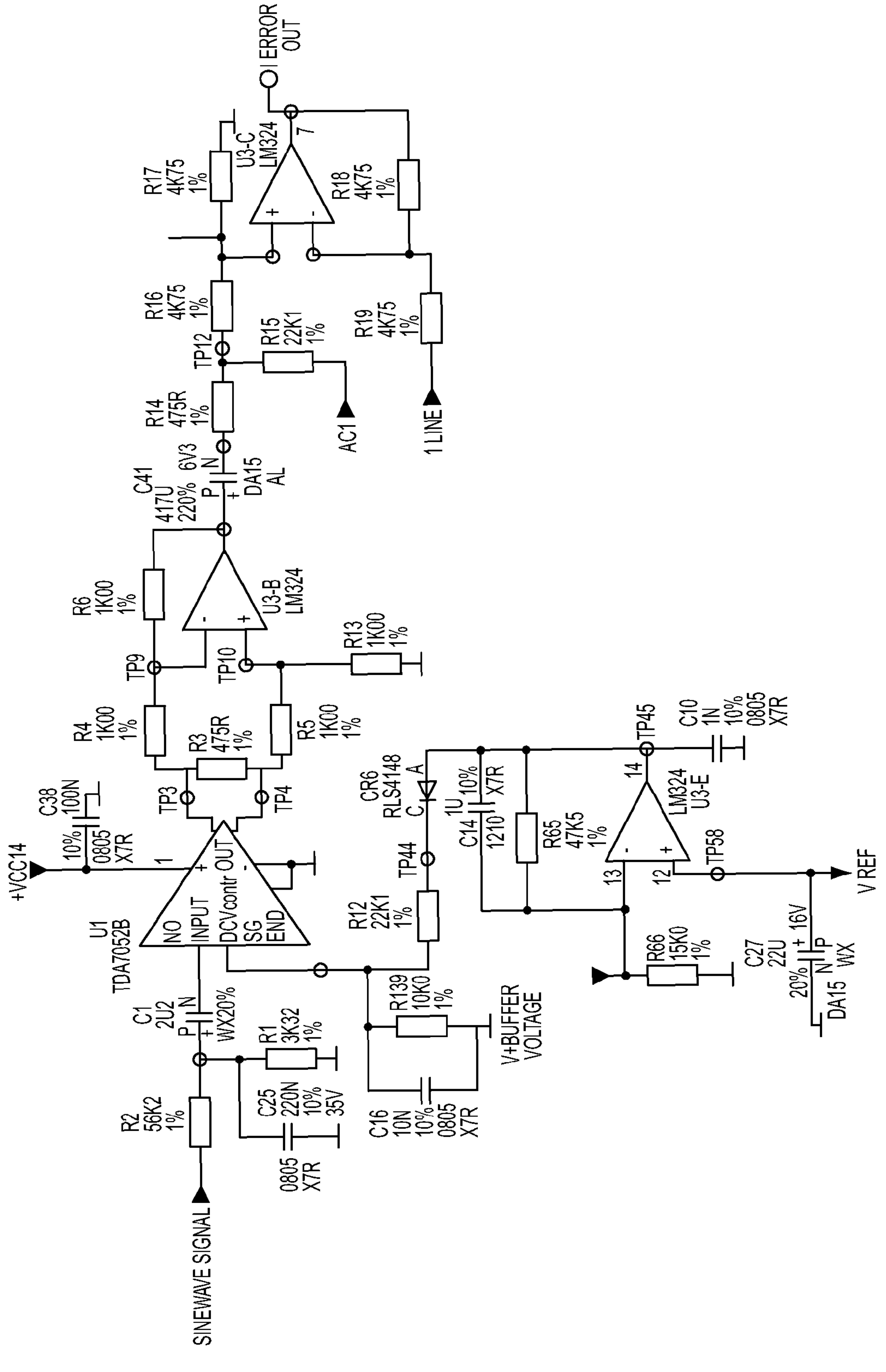
FIGS. 5 and 6 are schematics of the exemplary control circuit illustrated in FIG. 4.
Figure 6:
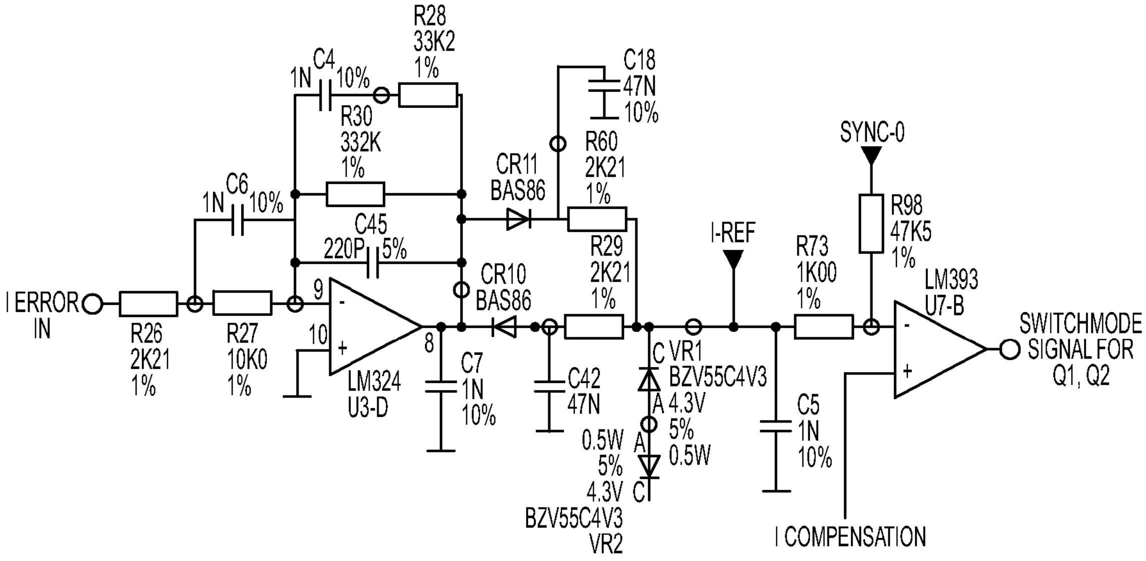

FIG. 5 shows a section of a Sorrento active line filter schematic which controls the energy buffer voltage. In FIG. 6 the high gain amplifier and comparator section is shown.

Figure 7:
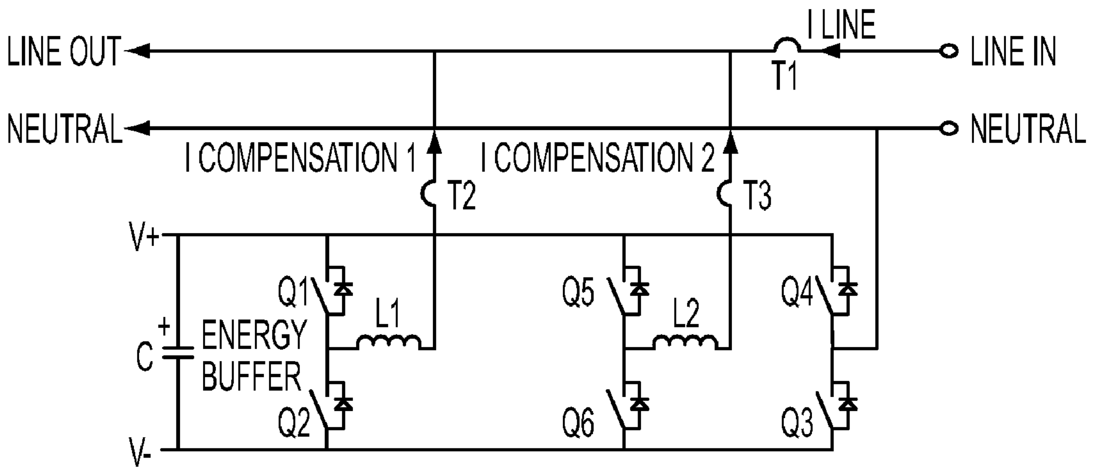
FIG. 7 is a schematic of another exemplary active power filter including a dual phase-locked switch mode for reducing ripple current.

With reference to FIG. 7, illustrated is a basic schematic of a dual phase-locked power circuit for an active line filter. Notably, the power circuit previously described has only one switch mode circuit. Consequently, response speed is limited by the value of the used inductor. A low inductance value will give a fast response but will give also a significant ripple current. As the line impedance is very inductive and the load capacitive, a large ripple current will lead to significant ringing. The benefits associated with the addition of a second compensation circuit include the following:

In situations where the load current changes very fast the power switches are controlled such that both inductors have a di/dt in the same direction. This will double the compensation speed.

When there is no fast change in load current both switching stages operable in opposite directions so that total ripple current is reduced.

Figure 8:
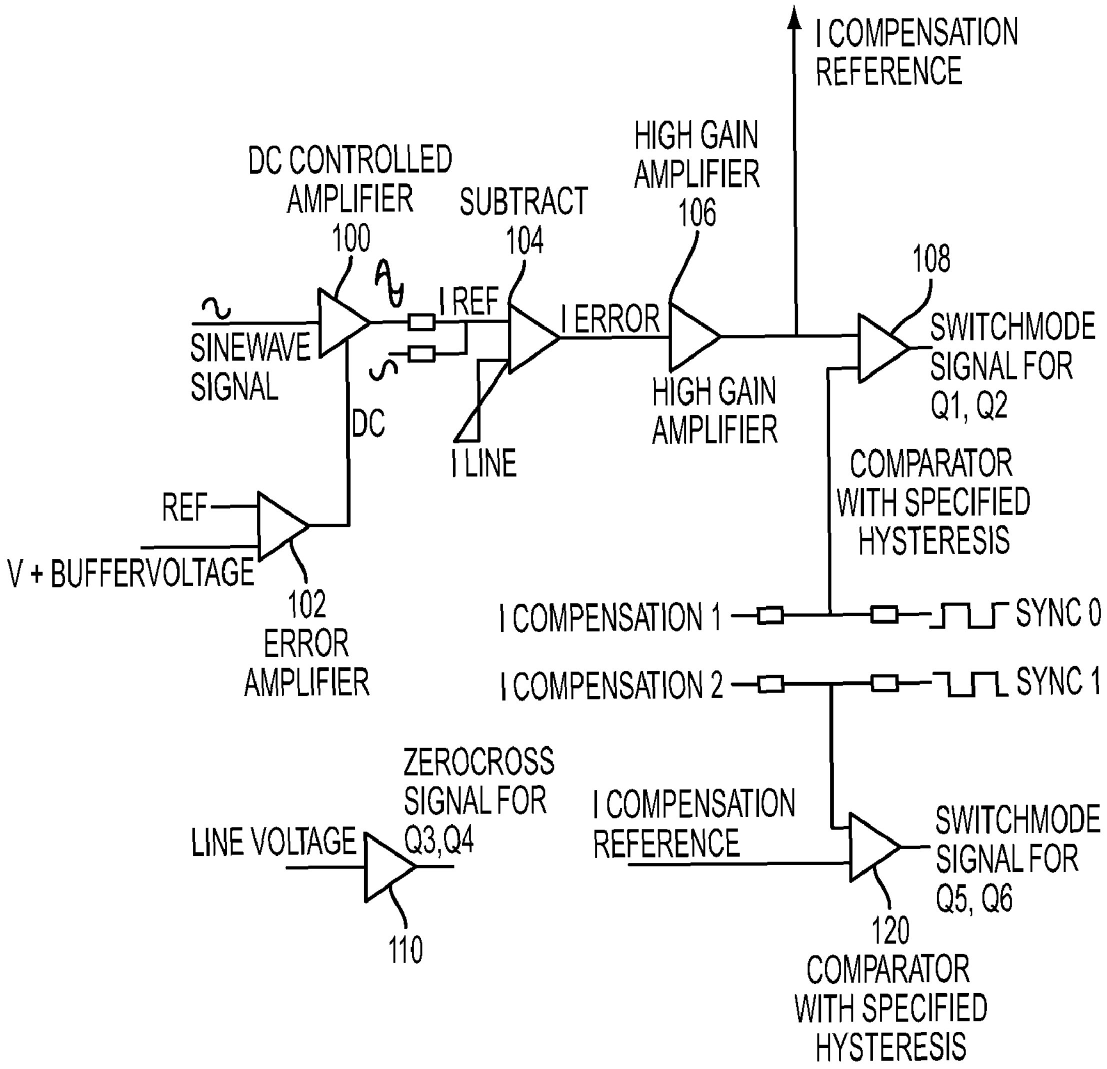
FIG. 8 is a schematic of an exemplary control circuit associated with the control of an active power filter as illustrated in FIG. 7.
Figure 9:
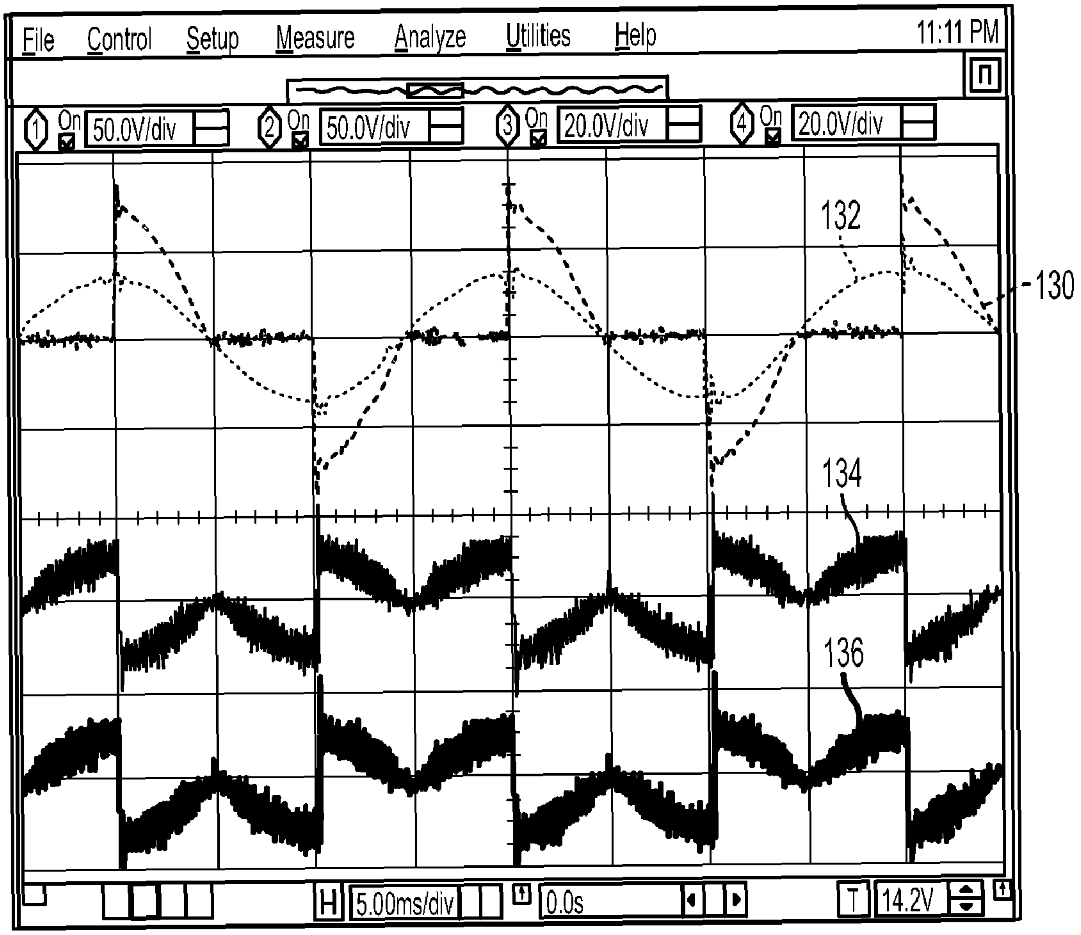
FIG. 9 is a graph of a typical distorted lie current, a corrected line current and the current associated with the two compensation circuits illustrated in FIG. 7.

The control circuit in FIG. 8 controls the line current "I line" such that its shape is sinusoidal and it regulates the average buffer voltage "V+." It generates an "I compensation reference" which is used as input to the circuit described with reference to FIG. 7. The principle is to add a square wave signal to the first "I compensation" signal before it goes into the comparator and an inverted signal to the other "I compensation" signal. This results in an inverted switching of the two power stages when there is no large change in compensation current required. The graph of FIG. 9 shows in the upper half, a typical distorted load current 130 and the corrected line current 132. In the lower half the current of the two compensation sections is shown, 134 and 136.

Figure 10:
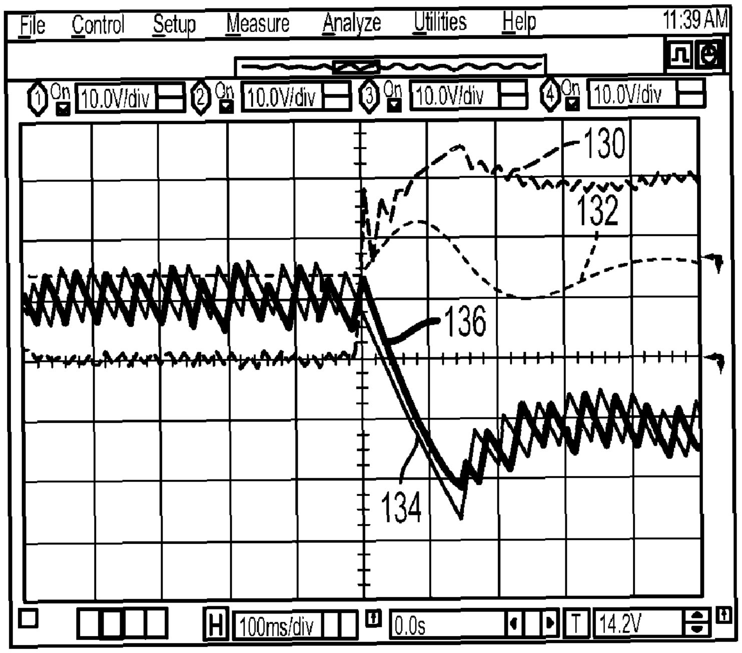
FIG. 10 is a magnified version of the graph illustrated in FIG. 9.

The graph of FIG. 10 shows again the distorted load current 130, corrected line current 132 and the current in the two compensations circuits 134 and 136. The sawtooth wave form of the two compensation lines are in opposite directions. But as soon as there is a fast change in load current, both currents move in the same direction.

Figure 11:
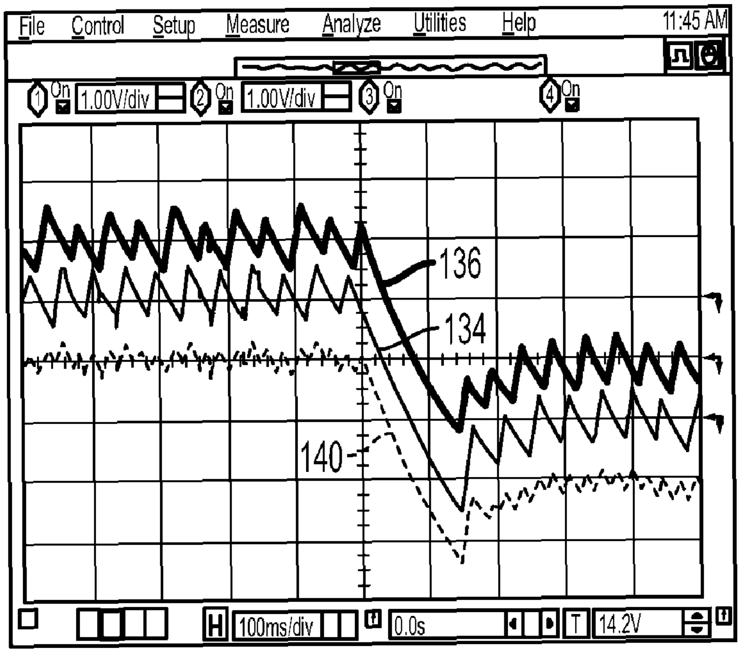
FIG. 11 is a graph of the sum of the two compensation currents of FIGS. 9 and 10.

The lower line 140 in FIG. 11 shows the sum of the two compensation lines. It is clearly visible that the ripple current compared to the compensation step is much lower.

An "ideal" active line filter should immediately respond to fast load changes. This however is limited by the L value of the inductor. A smaller inductor value introduces a higher ripple current and hence, due to the nature of the line impedance, will lead to significant ringing.

Then additional control circuit provided adds a squarewave to the compensation signals in such a way that it results in an inverted switching of one of the two power stages, when no large change in compensation current is required. This results in a lower ripple. However, as soon as there is a large compensation current required, the power switches are switched with an identical signal and move the currents in the same direction resulting in double speed switching.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An active line filter comprising:

an ac line input:

an ac neutral connection point;

an ac line output;

a first switching configuration including a first transistor and a second transistor operatively connected in series;

a second switching configuration including a third transistor and a fourth transistor operatively connected in series, and an energy buffer operatively connected to the ac neutral connection point and ac line output, the energy buffer being a capacitor with a positive terminal and a negative terminal and an energy buffer voltage across the capacitor is regulated by a DC controlled amplifier, wherein the active line filter is configured to measure a momentary ac line output current, measure a momentary ac line input current, switch the energy buffer to provide additional current to the ac line output when the momentary ac line output current is greater than the momentary ac line input current and switch the energy buffer to draw current from the ac line input when the momentary ac line output current is less than the momentary ac line input current, and wherein the capacitor is operatively connected in parallel to the first and second switching configurations and the first switching configuration is operatively connected to the ac line output to switch the capacitor at a predetermined duty cycle for providing the additional current to the ac line output when the measured ac line output current is greater than the momentary ac line input current and switch the capacitor at the predetermined duty cycle to draw current from the ac line input when the momentary ac line output current is less than the momentary ac line input current.

2. The active line filter according to claim 1, wherein the first, second, third and fourth transistors are MOSFETs.

3. The active line filter according to claim 1, wherein the second switching configuration switches the capacitor to provide additional current to the ac line output during the positive half cycle of the ac line input current, and switches the capacitor to draw current during the negative half cycle of the ac line input current.

4. The active line filter according to claim 1, comprising:

a third switching configuration including a fifth transistor and a sixth transistor operatively connected in series, wherein the capacitor is operatively connected in parallel to the third switching configuration and the third switching configuration is operatively connected to the ac line output to switch the capacitor at a predetermined duty cycle for providing part of the additional current to the ac line output when the measured ac line output current is greater than the momentary ac line input current and switch the capacitor at the predetermined duty cycle to draw part of the current from the ac line input when the momentary ac line output current is less than the momentary ac line input current.

5. The active line filter according to claim 4, wherein the active line filter is configured to operate the first and third switching configurations in opposite directions to reduce the total ripple current, relative to operating the first and third switching configurations in the same direction.

6. The active line filter according to claim 1, comprising a current transformer operatively connected to the ac line output to measure the ac line output current.

7. The active line filter according to claim 1 comprising a transformer operatively connected to the ac line input and neutral connection point to generate a reference sinusoidal signal associated with the ac line input current.

8. A printing apparatus comprising:

a printing device;

a power supply operatively connected to the printing device; and an active line filter operatively connected to the printing device and the power supply comprising:

an ac line input:

an ac neutral connection point;

an ac line output;

a first switching configuration including a first transistor and a second transistor operatively connected in series;

a second switching configuration including a third transistor and a fourth transistor operatively connected in series, and an energy buffer operatively connected to the ac neutral connection point and ac line output, the energy buffer being a capacitor with a positive terminal and a negative terminal and an energy buffer voltage across the capacitopr is regulated by a DC controlled amplifier, wherein the active line filter is configured to measure a momentary ac line output current, measure a momentary ac line input current, switch the energy buffer to provide additional current to the ac line output when the momentary ac line output current is greater than the momentary ac line input current and switch the energy buffer to draw current from the ac line input when the momentary ac line output current is less than the momentary ac line input current, wherein the energy buffer is a capacitor with a positive terminal and a negative terminal, and wherein the capacitor is operatively connected in parallel to the first and second switching configurations and the first switching configuration is operatively connected to the ac line output to switch the capacitor at a predetermined duty cycle for providing the additional current to the ac line output when the measured ac line output current is greater than the momentary ac line input current and switch the capacitor at the predetermined duty cycle to draw current from the ac line input when the momentary ac line output current is less than the momentary ac line input current.

9. The printing apparatus according to claim 8, wherein the first, second, third and fourth transistors are MOSFETs.

10. The printing apparatus according to claim 8, wherein the second switching configuration switches the capacitor to provide additional current to the ac line output during the positive half cycle of the ac line input current, and switches the capacitor to draw current during the negative half cycle of the ac line input current.

11. The printing apparatus according to claim 8, wherein the active line filter comprises:

a third switching configuration including a fifth transistor and a sixth transistor operatively connected in series, wherein the capacitor is operatively connected in parallel to the third switching configuration and the third switching configuration is operatively connected to the ac line output to switch the capacitor at a predetermined duty cycle for providing part of the additional current to the ac line output when the measured ac line output current is greater than the momentary line input current and switch the capacitor at the predetermined duty cycle to draw part of the current from the ac line input when the momentary ac line output current is less than the momentary ac line input current.

12. The printing apparatus according to claim 11, wherein the active line filter is configured to operate the first and third switching configurations in opposite directions to reduce the total ripple current, relative to operating the first and third switching configurations in the same direction.

13. The printing apparatus according to claim 8, wherein the active line filter comprises a current transformer operatively connected to the ac line output to measure the ac line output current.

14. The printing apparatus according to claim 8, wherein the active line filter comprises a transformer operatively connected to the ac line input and neutral connection point to generate a reference sinusoidal signal associated with the ac line input current.

* * * * *